United States Patent
Cesar

[11] Patent Number: 5,106,322
[45] Date of Patent: Apr. 21, 1992

[54] ELECTRICAL COMPUTER CONNECTION SYSTEM

[75] Inventor: Charles Cesar, St. Martin D'Heres, France

[73] Assignee: Bull S.A., Paris, France

[21] Appl. No.: 377,074

[22] Filed: Jul. 10, 1989

[30] Foreign Application Priority Data

Jul. 13, 1988 [FR] France .................. 88 09590

[51] Int. Cl.⁵ .............................................. H05K 7/10
[52] U.S. Cl. ................................... 439/377; 361/394; 364/708
[58] Field of Search ........................ 439/55, 76, 59–62, 439/74, 502, 374, 377; 361/395–399, 412, 413, 391, 394; 364/708; 324/158 P, 158 F; 369/75.1

[56] References Cited

U.S. PATENT DOCUMENTS

| | | | |
|---|---|---|---|
| 2,602,842 | 7/1952 | Morris et al. | 312/319 |
| 3,267,333 | 8/1966 | Schultz | 165/185 |
| 3,667,045 | 5/1972 | Combs | 361/408 |
| 4,084,250 | 4/1978 | Albertine et al. | 364/708 |
| 4,226,491 | 10/1980 | Kazama et al. | 439/76 |
| 4,388,671 | 6/1983 | Hall et al. | 361/395 |
| 4,399,487 | 8/1983 | Neumann | 361/395 |
| 4,602,164 | 7/1986 | Gore III et al. | 307/91 |
| 4,689,721 | 8/1987 | Damerow et al. | 361/398 |
| 4,840,570 | 6/1989 | Mann, Jr. et al. | 439/74 |
| 4,862,353 | 8/1989 | Williams | 361/394 |
| 4,888,549 | 12/1989 | Wilson et al. | 324/158 F |
| 4,889,959 | 12/1989 | Taylor et al. | 439/95 |
| 4,937,806 | 6/1990 | Babson et al. | 369/75.1 |
| 4,941,841 | 7/1990 | Darden et al. | 439/296 |
| 4,972,297 | 11/1990 | Zell et al. | 361/394 |

FOREIGN PATENT DOCUMENTS 2122424 1/1984 United Kingdom .

Primary Examiner—Neil Abrams
Attorney, Agent, or Firm—Kerkam, Stowell, Kondracki & Clarke

[57] ABSTRACT

The present invention relates to an electrical computer connection system suitable for computer manufacture of all types, from work stations to specialized computers such as those containing PABXs. According to the invention, a cartridge (2) contains the integratable peripheral (1). A main connector (9) is fixedly disposed in accordance with the connection standard of the system, and the three secondary (3, 4, 5) connectors being arranged to distribute the connections in accordance with the type of peripheral.

7 Claims, 1 Drawing Sheet

ELECTRICAL COMPUTER CONNECTION SYSTEM

TECHNICAL FIELD

The present invention relates to an electrical computer connection system. Its field of application includes computer manufacture of all kinds, from work stations to specialized computers such as those containing private automatic branch exchanges, or PABXs.

BACKGROUND

Computers are known in the prior art that include peripherals integrated with the housing of the host computer. Such peripherals are often magnetic mass memories, badge or chip card readers. For performing maintenance of such computers, it is necessary for the technician to gain access to the peripheral and be able to remove the integrated peripheral.

A first solution that suggests itself is to provide a host computer housing in two parts, one of which can be removed from the other, making access to the defective peripheral possible.

The disadvantage of such a solution is particularly that the power to the computer must be cut because the grounding of the housing is disconnected by its being opened. This means that the data processing operation being performed at that time must be interrupted. Accordingly, this solution is inappropriate for industrial process control applications or communications applications, for example.

A solution to this problem, which is possible only for large systems and is not very satisfactory, consists in providing a replacement unit that is automatically connected in place of the defective unit. Such a solution is expensive, however, and furthermore the addressing facilities are not convenient to use.

In a certain number of applications, a need has arisen for repair that does not necessitate shutting down or disabling the host computer. Such a concept has led to the design of a complete computer made up of component units, based on so-called modular change and repair units or CRUs. Such a solution presents mechanical problems that are difficult to solve when standardization must be adhered to.

In fact, it is out of the question to provide specific peripherals adaptable to the CRU concept, once mass production or standardized production is to be done. Although peripheral dimensions (slimline format, 5¼ inches, or 3½ inches) are well accepted in the profession, the same cannot be said for the connectors that make it possible to electrically connect the integrated peripheral to the interface circuits of the host computer.

In the prior art, one skilled in the art might be able to find a solution to problems resulting from standardization using techniques used to connect two connectors on printed circuits, in particular to adapt a pin connector of a first type to a pin connector of a second type. Such a solution is particularly satisfactory from the standpoint of reliability and applicability to industrial use. However, it does not work in the case where the connectors must be connected at indeterminate, undefined locations.

SUMMARY OF THE INVENTION

The subject invention provides a solution to the aforenoted problems and relates to an electrical computer connection system having a removable peripheral disposed inside the host computer, characterized in that it includes:

a cartridge that contains the peripheral unit per se, the cartridge being intended for insertion into the housing of the host computer;

a first connector fixed to the outside of the cartridge in a position meeting the standards for connection of peripherals to the host computer;

at least two secondary connectors housed in an inside space in the cartridge and connected electrically to the first connector, each connector having a predetermined function such as the connection of the data signals or the connection of the commands signals of the peripheral, these secondary connectors being capable of being plugged directly into the connectors of each type of peripheral at locations depending on the connectors belonging to the peripheral.

The invention also makes it possible to solve the problems involved in such a technology, by proposing electromagnetic shielding means and cooling means.

It is also adapted to wire-type connections.

BRIEF DESCRIPTION OF THE DRAWINGS

Further characteristics and advantages of the present invention will be better understood from the ensuing description and the drawing figures, in which.

DESCRIPTION OF THE PREFERRED EMBODIMENT

Figure 1:
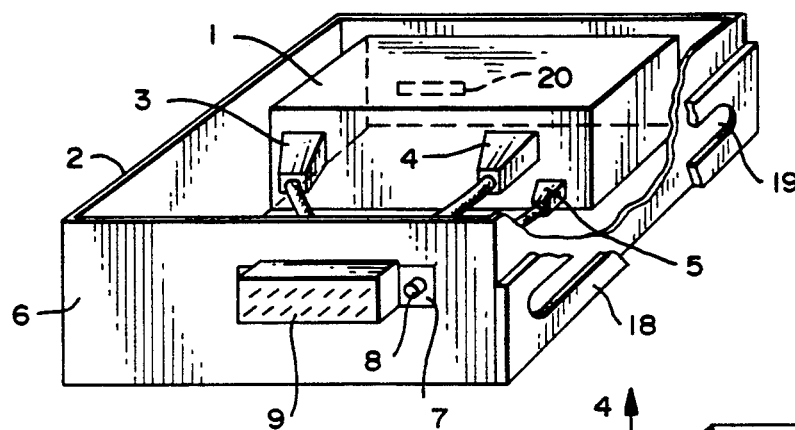
FIG. 1 is a drawing showing an embodiment of the invention.

Referring to FIG. 1, an embodiment according to the invention is shown. The peripheral 1 is contained in a cartridge 2. The back panel of the peripheral has three connectors 3, 4, 5 reserved for the data, the electrical power and the command signals, respectively, of the peripheral 1. A back panel 6 of the cartridge 2 has an external connector 9 which may be a standard connection type, such as, for example, a DIN 41612. The connector 9 is fixed to the cartridge 2 by a system of lugs such as 7 and screws 8.

The three secondary connectors 4 and 5 are electrically connected to a standard connector 9 with three separate cords of insulated electrical wires. The length of the cords is calculated for each type of peripheral as a function of the location of its own particular connectors, which varies from one type of peripheral to another.

In FIG. 1, the cartridge 2 that contains the peripheral 1 includes means for convenient insertion of the cartridge into the housing of the host computer. These means, in a preferred embodiment, comprise two drawer slides, such as the drawer slide 18, into which rail guides such as the rail guide 19 are cut. The inside of the rail guide 19 is being engaged by a rolling element such as a wheel integral with the housing of the host computer.

Figure 2:
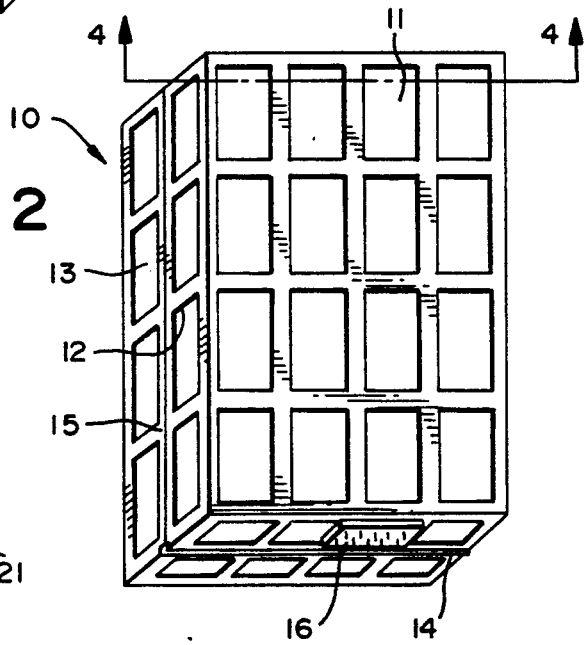
FIG. 2 is a drawing of another embodiment according to the invention.
Figure 3:
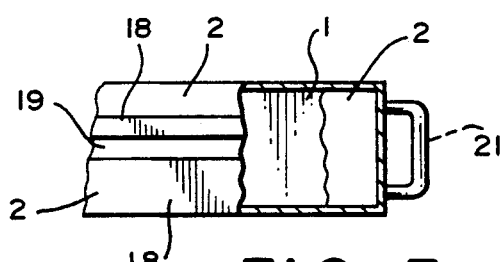
FIGS. 3 and 4 show different features of the invention.
Figure 4:
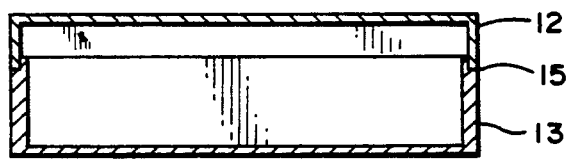

FIG. 2 illustrates a different embodiment of the invention. In FIG. 2., the cartridge 10 is made of a conductive material, such as a steel sheet. The cartridge 10 is configured in two halves, which pivot on a hinge 14 disposed in the back panel of the cartridge, that is, the side that is inserted first into an insertion slot provided in the host computer.

The complete assembly comprises a protection cage, which both shields against electromagnetic radiation from outside the cartridge and blocks parasitic emissions from the peripheral that it contains.

To permit effective ventilation of the peripheral, the cartridge 2 is pierced with openings, the number and area of which are calculated as a function of the cooling air flow through the insertion compartment and the power dissipated by the internal peripheral.

The overlapping edge 15 of the two halves 12, 13 of the cartridge 10, constituted by an overlap of one sheet of one half on the other sheet of the other half, makes it possible to protect against the escape of radiation. This overlap is formed as a fold of the sheet in this region, which has the further advantage of making the assembly mechanically stronger.

In FIG. 2, a connector 16 is intended to be engaged in a corresponding fixed connector installed in the insertion housing of the host computer. In this way, the host computer is no longer dependent on the connecting system of the peripheral; the conversion is assured by the cartridge 10. Thus a designer is always able to obtain integratable peripherals and the connectors for standard connectors from various manufacturers.

In an exemplary embodiment, the cartridge is provided with handle means, for easier maintenance, and mechanical foolproofing means, to prevent incorrect installation of the cartridge. To this end, a handle 21 is placed on the front panel of the cartridge, which also includes a slot 20 for the passage of a diskette, in the case of a floppy disk, or cassette, in the case of a magnetic tape cassette reader.

I claim:

1. An electrical computer connection system comprising means for removably disposing peripheral equipment for computers such as magnetic mass memories, badge or chip readers, disk readers and magnetic tape readers inside a host computer, a conductive cartridge (2) having sides and a back panel disposed about said peripheral equipment for protection against electromagnetic radiation contacting at least one peripheral equipment (1) housed in an internal space of the cartridge, said sides and back panel being formed in two halves and having openings therein for cooling the peripheral equipment contained therein, each half having an overlapping edge, a hinge disposed on the back panel for pivoting one of said halves to house said peripheral equipment, a main connector (9) fixed on the outside of the sides of the cartridge in a predetermined position relating to the standards for connection of peripherals to host computers, at least two secondary connector means (3, 4, 5) for each peripheral equipment housed in the internal space of the cartridge and electrically connected by separate flexible conduits to the main connector (9), a first one of said secondary connector means (3) comprising a first connector having a predetermined function for the connection of the data signals, a second one of said secondary connector means (4, 5) comprising a second connector having a predetermined function for the connection of the command signals and power supply to the peripheral, said first and second connectors (3, 4, 5) adapted to be fixed mechanically at locations depending on the positions of the corresponding connectors belonging to the peripheral equipment (1) and said separate flexible conduits enabling one said peripheral equipment to be replaced by another having said corresponding connectors located at different spacings thereon.

2. An electrical connection system as defined by claim 1, further including means for grasping and removing the cartridge from the computer system so as to facilitate maintenance of the computer system.

3. An electrical connection system as defined by claim 1, including a handle disposed on the front panel of an installed peripheral.

4. An electrical connection system as defined by claim 1, including sliding means (18, 19) for facilitating withdrawal of peripheral equipment for maintenance purpose, said sliding means including at least one drawer slide.

5. An electrical connection system as defined by claim 1, including mechanical foolproofing means, for preventing the cartridge from being installed incorrectly.

6. An electrical connection system as defined by claim 1, the second one of said secondary connector means (4, 5) being constituted by a connector for supplying the command signals (4) and further including a third connector (5) for supplying the power.

7. An electrical connection system as defined by claim 1, wherein the first main connector (9) is positioned in accordance with the connection standard of the data processing system for signal distribution and at geometrical positions such as to adapt any type of peripheral to the host data processing system.

* * * * *

UNITED STATES PATENT AND TRADEMARK OFFICE
CERTIFICATE OF CORRECTION

PATENT NO. : 5,106,322
DATED : April 21, 1992
INVENTOR(S) : Charles CESAR

It is certified that error appears in the above-identified patent and that said Letters Patent is hereby corrected as shown below:

Col. 3, claim 1, line 8 "contacting" should be --containing--.

Signed and Sealed this

Fifth Day of October, 1993

BRUCE LEHMAN

*Attest:*

*Attesting Officer*          *Commissioner of Patents and Trademarks*